US007215160B2

(12) United States Patent
Liu

(10) Patent No.: US 7,215,160 B2
(45) Date of Patent: May 8, 2007

(54) SWITCHED OPERATION AMPLIFIER

(75) Inventor: Chih-Min Liu, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 15 days.

(21) Appl. No.: 11/236,673

(22) Filed: Sep. 28, 2005

(65) Prior Publication Data

US 2006/0066360 A1    Mar. 30, 2006

(30) Foreign Application Priority Data

Sep. 29, 2004    (TW) .............................. 93129478 A

(51) Int. Cl.
*G11C 27/02* (2006.01)
*G06G 7/12* (2006.01)

(52) U.S. Cl. ........................................ 327/94; 327/560

(58) Field of Classification Search ................. 327/91, 327/94, 560–563; 330/9, 253
See application file for complete search history.

(56) References Cited

U.S. PATENT DOCUMENTS

| 5,789,980 | A | * | 8/1998 | Nagata et al. | .............. 330/253 |
|---|---|---|---|---|---|
| 5,959,470 | A | * | 9/1999 | Sugihashi | ..................... 327/94 |
| 6,236,269 | B1 | * | 5/2001 | Hojabri | ...................... 330/253 |
| 6,236,270 | B1 | * | 5/2001 | Takeuchi | .................... 330/253 |
| 6,590,980 | B1 | * | 7/2003 | Moraveji | .................... 380/255 |
| 6,987,420 | B2 | * | 1/2006 | Miura | ......................... 330/255 |
| 2004/0212425 | A1 | * | 10/2004 | Parkhurst | .................... 327/563 |

* cited by examiner

*Primary Examiner*—Quan Tra
*Assistant Examiner*—Rey Aranda
(74) *Attorney, Agent, or Firm*—Troxell Law Office, PLLC

(57) ABSTRACT

A switched operation amplifier including a biased circuit, an amplifier circuit, and a buffer circuit is provided. The biased circuit is to provide a first, a second, and a third biased signals by means of an input signal and a reference current source. The amplifier circuit is driven by the biased signals through current mirrors, a sample-and-hold switch, a complementary sample-and-hold switch and a differential pair. The buffer circuit includes a capacitor and two transistors in series. An output signal is generated from a node in between the two transistors, and fed back to a negative terminal of the differential pair of the amplifier circuit. The amplifier circuit charges the capacitor and controls one of the transistors of the buffer circuit until the voltages of a positive and the negative terminal of the differential pair are equal. By means of the operation of the switched op amplifier, the output voltage can be kept being stable.

11 Claims, 3 Drawing Sheets

SWITCHED OPERATION AMPLIFIER

FIELD OF INVENTION

This invention relates to a sample-and-hold circuit, more particularly, to a sample-and-hold circuit having a switched operation amplifier designed.

BACKGROUND OF INVENTION

A sample/hold circuit is mainly utilized in the front stage of ADC (analog to digital converter) to increase data accuracy while sampling data. The sample-and-hold circuit is thus a critical factor on the whole circuit performance. It is widely applied in the electronic device. For instance, as the CD/DVD chip operated at burning mode, it is demanded that a sample-and-hold (S/H) circuit ensures the output voltage stable while sampling or holding data. Generally, the sample-and-hold circuit may have many forms to present. Following switched operation amplifier (SOP) is the common one.

Referring to FIG. 1, a SOP circuit according to prior art is shown. An operation amplifier (OP) having a positive terminal and a negative terminal is connected to a switch S/H. The switch S/H is coupled to a buffer and a capacitor $C_h$ which is connected to ground. The buffer has an output voltage $V_{OUT}$ feedback to the negative terminal to form a voltage $V_N$. As the switch S/H is on, it is a sampling mode having the voltage $V_{OUT}$ feedback into the negative terminal of the OP to make the voltage $V_{OUT}$ equal to an input voltage $V_P$ received from the positive terminal. In the meantime, the capacitor $C_h$ is charged to follow the input voltage $V_P$. As the switch S/H is off, it is the holding mode that the output voltage $V_{OUT}$ is provided only from the capacitor $C_h$ so that the voltage $V_{OUT}$ is approximately equivalent to the input voltage $V_P$.

FIG. 2 shows detailed circuit diagram of the SOP according to FIG. 1. The SOP includes an amplifier circuit 10, a biased circuit 12 and a buffer circuit 14. The amplifier circuit 10 composed of transistors M0 to M12 has a differential pair (M1, M2) to receive the input voltage $V_P$ and the voltage $V_N$ which is feedback from the output voltage $V_{OUT}$ respectively. The biased circuit 12 composed of transistors M15 to M24 generates biased voltages bp0, bpc, bnc, bn0 for the amplifier circuit 10 and the buffer circuit 14, which is composed of transistors M13, M14 and the capacitor $C_h$. The buffer circuit 14 generates the output voltage $V_{OUT}$ according to the voltage $V_{NZ}$ at the node NZ. The output voltage $V_{OUT}$ is feedback to the negative terminal of the differential pair (M1, M2) to form the voltage $V_N$.

In the sampling mode (switch S switched on, switch H switched off), the transistors M7, M8, M9, M10 are in active region by either biased voltage bpc or bnc, and the capacitor $C_h$ is charged to a predetermined voltage ($V_P$) via the node NZ so that the output voltage $V_{OUT}$ equals to the predetermined voltage ($V_P$). Worthwhile to note, the biased voltages bnc, bn0 are generated by two current sources $i_1$, $i_2$ through the transistors M15, M17, which are diode-connected transistor. The biased voltages bnc, bn0 then derives mirror currents through current mirror (transistors M18, M20, M19, M21), while biased voltages bpc, bp0 is arisen through PMOS transistors M22, M23, M24. Still, the biased voltage bn0 is fed into a gate of transistor M0 of the amplifier circuit 10 to generate a tail current $i_t$. The tail current $i_t$ then branched into two current $i_{t1}$, and $i_{t2}$ on transistors M1, M2 of the differential pair, where $i_{t1}=(\frac{1}{2})i_t+\Delta i$, and $i_{t2}=(\frac{1}{2})i_t-\Delta i$.

Furthermore, the current $i_{t1}$ generates a mirror current $i_{t3}$ through current mirror (M3, M5). The current $i_{t3}$ flows through transistors M7, M9, M11 and next again generates mirror current $i_{t4}$ through transistor M12 by the current mirror relationship. A mirror current $i_{t5}$ of the current $i_{t2}$ flows through transistors M4, M6, M8. The mirror current $i_{t5}$ associated with the mirror current $i_{t4}$ determines the voltage $V_{NZ}$ of the node NZ by charging the capacitor $C_h$. The voltage $V_{NZ}$ turns on the transistor M13 such that the output voltage $V_{OUT}$ equals to the voltage $V_N$, and equals to the input voltage $V_P$.

In the holding mode (switch H switched on, switch S switched off), the transistors M7, M8, M9, M10 are in cut-off region due to the gates of the transistors M7 and M8 are connected to VDD (for PMOS) and the gates of the transistors M9 and M10 are connected to ground (for NMOS). The input voltage $V_P$ can not affect the output voltage $V_{OUT}$. The output voltage $V_{OUT}$ is kept to a value determined by the capacitor $C_h$.

However, many problems are found in accordance with aforementioned prior art. For instance, ground voltage drifted due to turning on the transistors M7, M8, M9, M10 in the sampling mode, will generate about 400 mA, which depends on the size of the transistors, such as channel width/channel length (W/L). In the holding mode, all of the transistors M7, M8, M9, M10 are turned off, which results in current variation due to effect of stray resistors while upon switching. The current variation will affect the ground potential variation, further, affecting the output voltage, or even causing malfunctions.

In addition, two sets of current source $i_1$, $i_2$ in the biased circuit 12 are utilized to generate biased voltages bn0, bnc, bp0, bpc according to prior art. Thus, if it is desired to shift the bandwidth of the SOP, a direct method is to change the current of the current sources $i_1$ and $i_2$. However, owing to cascade structure of the transistors (M15 to M21 are coupled among another), any biased current change will shift the biased voltage, which results in the transistors cannot work at optimum working range. Consequently, bandwidth variability is restricted seriously.

Another disadvantage is the setting limitation. The biased voltages of the transistors M7, M8, M9, M10 are switched rapidly between the biased voltage bnc to ground or the biased voltage bpc to VDD. Therefore, the voltages on gates of M7, M8, M9 and M10 will be set individually in the sampling mode. If the setting speed of the biased voltage bnc to ground is different from the setting speed of the biased voltage bpc to VDD, it will result in the output voltage temporarily unstable, and the setting time is extended.

An object of the present invention is to propose a newly structure of SOP to solve above problems.

SUMMARY OF THE INVENTION

An object of the present invention is to provide a SOP having a stable output voltage, a better bandwidth performance.

According to an embodiment of the present invention, a SOP includes an amplifier circuit, a biased circuit, and a buffer circuit. The biased circuit is to provide a first, a second, and a third biased signal. The amplifier circuit includes a first transistor, a second differential pair, a third, a fourth, a fifth current mirror, a sample-and-hold switch, and a complementary sample-and-hold switch. The first transistor is controlled by the first biased signal so as to provide two reference currents for the third and fourth current mirror, which are, respectively, connected with two transistors of the second differential pair. Further, a mirror current of the third current mirror is controlled by the third biased signal to determine whether the third mirror current of the third current mirror is fed into a reference terminal of the fifth current mirror or not. A mirror current terminal of the fourth current mirror is connected with both of the sample-and-hold switch and the complementary sample-and-hold switch so as to provide a current path either though the sample-and-hold switch to a mirror terminal of the fifth current mirror, or the complementary sample-and-hold switch to ground depending on sampling mode or holding mode being selected. Two gates of the two transistors of the second differential pair are served, respectively, as a positive and a negative terminal. A buffer circuit having a capacitor, a second and a third transistor wherein the capacitor is connected between ground and a node connected both of the sample-and-hold switch and a gate of the second transistor. A source terminal of the second transistor is connected with a drain terminal of the third transistor. Furthermore, the source terminal of the second transistor is served as a signal output terminal and fed back to the negative terminal. The third transistor is controlled by the second biased signal.

According to an embodiment of the present invention, wherein the biased circuit includes a first current mirror, a biased signal generator, a low output impedance buffer. The first current mirror is to generate the second biased signal according to a reference current. The biased signal generator is connected with a mirror terminal of the first current mirror to generate the first biased signal. The low output impedance buffer is connected with the first current mirror to generate the third biased signal according to a biased input signal.

According to an embodiment of the present invention, wherein the low output impedance buffer includes a fourth transistor, a first differential pair, and a second current mirror, wherein the fourth transistor is controlled by the second biased signal.

According to an embodiment of the present invention, wherein the sample-and-hold switch is composed of a fifth transistor in series connected with a sixth transistor and both of them are controlled by the third biased signal while switching to sampling mode.

According to an embodiment of the present invention, wherein the complementary sample-and-hold switch is a transistor having a source terminal connected with the fourth current mirror and is controlled by the third biased signal while switching to holding mode.

A method of operating a sample-and-hold circuit, for a switched operation amplifier is also provided. The switched operation amplifier including a biased circuit for generating a third biased signal, an amplifier circuit and a buffer circuit. The amplifier circuit has a second differential pair, a third, a fourth, a fifth current mirror, a sample-and-hold switch, and a complementary sample-and-hold switch. The buffer circuit has a capacitor. The method including the steps of: charging the capacitor through the fourth current mirror and the fifth current mirror by turning on the sample-and-hold switch to do signal sampling, the capacitor providing a rising voltage to a negative terminal of the second differential pair until the negative terminal has the same voltage as an input voltage received by a positive terminal of the second differential pair; and discharging the capacitor by turning off the sample-and-hold switch to do signal holding, while the complementary sample-and-hold switch is turned on to provide a current path for the fourth current mirror.

According to an embodiment of the present invention, wherein the sample-and-hold switch and the complementary sample-and-hold switch are controlled by the third biased signal, and one is activated while the other one is turned off according to signal holding or sampling.

According to an embodiment of the present invention, wherein the biased circuit includes only one current source to generate biased signals for the amplifier circuit and the buffer circuit.

According to an embodiment of the present invention, wherein the current path provided by the complementary sample-and-hold switch is conducted to ground.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

The present invention is to provide a switched operation amplifier (hereinafter called SOP) to avoid current unstable to result in ground voltage variation while doing sample-and-hold switching. Herein a preferred embodiment is depicted. The exemplary is for illustration conveniently only but not intended to limit the claim scope. The detailed of the invention is as follows.

Figure 3:
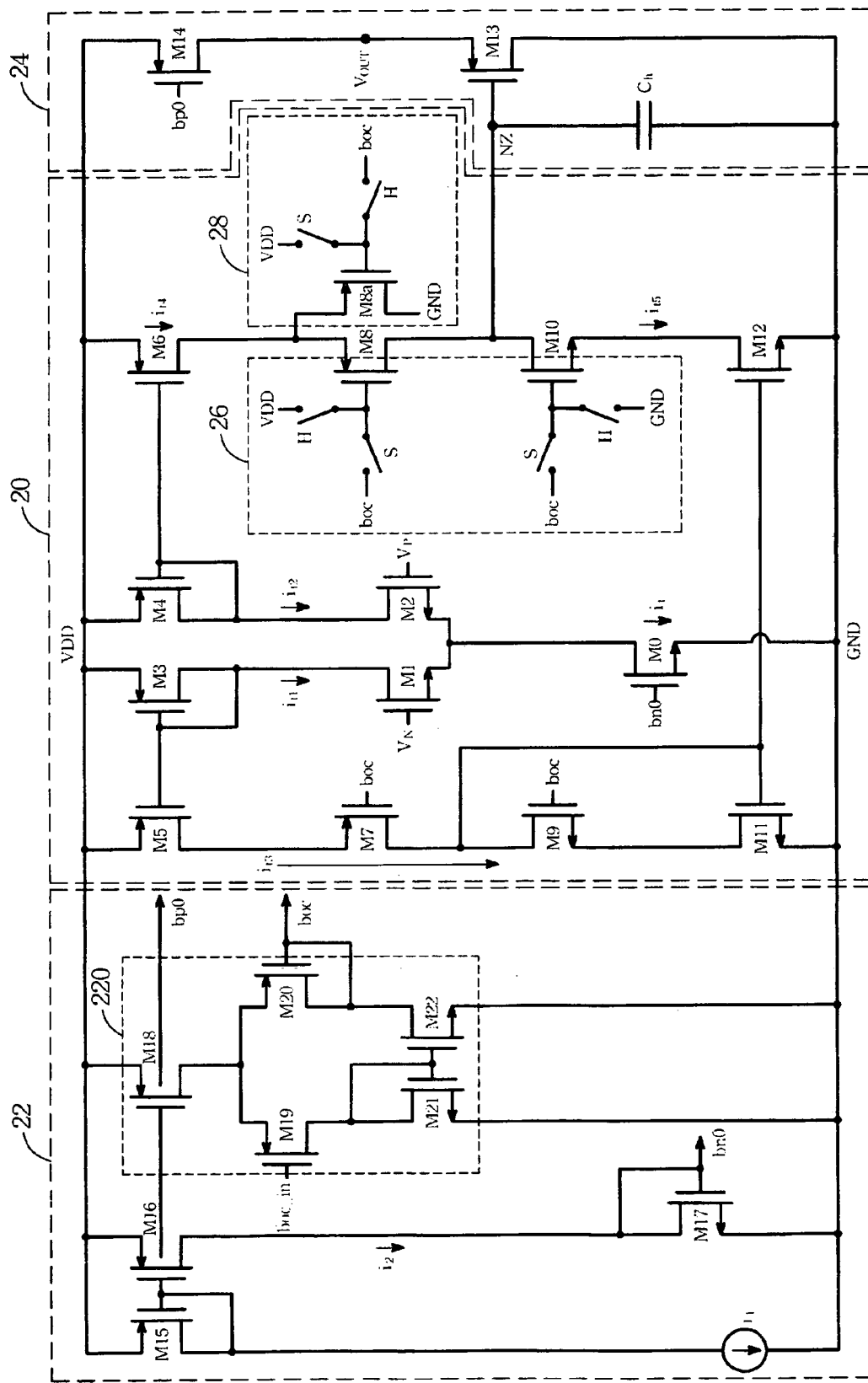
FIG. 3 shows detailed circuit of the SOP circuit according to an embodiment of the present invention.

Referring to FIG. 3, a SOP includes an amplifier circuit 20, a biased circuit 22, and a buffer circuit 24. The biased circuit 22 includes a first current mirror consisting of transistors M15, M16 and a low output impedance buffer 220 (transistors M18 to M22). A reference current $i_1$ through gates of the transistors M15 and M16 of the first current mirror generates a biased voltage bp0. Furthermore, a mirror current $i_2$ of the first current mirror is then through a biased voltage generator which is a transistor M17 having gate and drain connected together to generate a biased voltage bn0. The biased voltage bn0 is directed to the transistor M0 of the amplifier circuit 20 so as to generate a tail current $i_t$. The biased voltage bp0 is to drive a PMOS transistor M14 of the buffer circuit 24.

The output low impedance buffer 220 is composed of transistor M18, a first differential pair consisting of transistors M19 and M20, and a second current mirror consisting of transistors M21 and M22. The gate of the transistor M18 is coupled to gates of transistors M15 and M16 and driven by biased voltage bp0. Still, a drain of the transistor M18 coupled to sources of the transistors M19 and M20, and a gate of the transistor M19 is coupled to a biased input voltage boc_in. A gate and drain of the transistor M20 are connected together with a drain of the transistor M22. A gate and drain of the transistor M21 are connected together with a gate of the transistor M22 and a drain of the transistor M19.

The biased voltage bp0 is for driving the transistor M18. The biased input voltage boc_in generated by a voltage divided circuit of resistors (not shown) exerted to the transistor M19 of the differential pair (transistors M19, M20) and the current mirror (transistors M21, M22) thereby generating a biased voltage boc. The biased voltage boc, as shown, is to drive transistors M7, M9 of the amplifier circuit 20 and provide biased voltage of the transistors (M8, M10)

while switch S is switched on in the sampling mode. Worthwhile to note, the low output impedance buffer 220 having low output impedance is to make the biased voltage boc_in equal to the biased voltage boc by the second current mirror (transistors M21, M22) to provide the stable biased voltage boc for the amplifier circuit 20 (transistors M7, M8, M9, M10, M8a).

The amplifier circuit 20 includes the transistor M0, a second differential pair (transistors M1, M2), a third current mirror (transistors M3, M5, M7), a fourth current mirror (transistors M4, M6), a fifth current mirror (transistors M9, M11, M12), a sample-and-hold switch 26 (transistors M8, M10), and a complementary sample-and-hold switch 28 (transistor M8a). The gates of the transistors M1, M2 of the second differential pair are, respectively, coupled to voltages $V_P$, $V_N$ and served as a positive and a negative terminal of the amplifier circuit 20. The voltage $V_N$ comes from the output voltage $V_{OUT}$ of the buffer circuit 24. The voltage $V_P$ is an input voltage which comes from external signal. The sources of the transistors M1, M2 of the second differential pair are connected together then coupled to a drain of the transistor M0 which is controlled by biased voltage bn0 to generate a tail current $i_t$. A gate and drain of the transistor M3 are connected together then coupled to a drain of the transistor M1 and a gate of the transistor M5. Similarly, a gate and drain of the transistor M4 are connected together then coupled to a drain of the transistor M2 and a gate of the transistor M6. When the transistors M7 and M8 (or M8a) are activated by the biased voltage boc, the tail current $i_t$ is induced to generate two reference currents $i_{t1}$ for the transistor M1 and $i_{t2}$ for the transistor M2, wherein $i_t=i_{t1}+i_{t2}$. The current $i_{t1}$ and $i_{t2}$ is determined by the biased voltages $V_N$, $V_P$ of the transistors M1 and M2.

A mirror current $i_{t3}$ of the third current mirror is mirrored from the reference current $i_{t1}$ while the transistors M7, M9 are driven by the biased voltage boc. On the other hand, in the sampling mode when switch S is switched on and the switch H is switched off, the transistor M8 of the sample-and-hold switch 26 is turned on, a mirror current $i_{t4}$ of the fourth current mirror is mirrored from the reference current $i_{t2}$. According to the fifth current mirror, a mirror current $i_{t5}$ is mirrored from the reference current $i_{t3}$.

The buffer circuit 24 is composed of two PMOS transistors M14, M13 and a capacitor $C_h$. A drain of the transistor M14 is connected to the source of the transistor M13. The connection node of the transistors M14, M13 is for outputting the voltage $V_{OUT}$, which is feedback to the negative terminal $V_N$. A gate of the transistor M13 is connected to the drains of the M8 and M10 of the amplifier circuit 20. Also, the gate of the transistor M13 is connected with a terminal of the capacitor $C_h$, whose other terminal is grounded. Thus, in the holding mode, as the switch S switched on, switch H switched off in the sample-and-hold switch 26, the current $i_{t3}=i_{t5}$. The output current of the amplifier circuit 20 will persistently charge the capacitor $C_h$ until the current $i_{t4}=i_{t5}$. At that time $V_P=V_N=V_{OUT}$.

The complementary sample-and-hold switch 28 is a PMOS transistor M8a having its drain grounded. Both transistors M8a and M8 are circuit having their source connected with a drain of the transistor M6. The complementary sample-and-hold switch 28 is to provide a current path for the mirror current $i_{t4}$ conducted to ground while the sample-and-hold switch 28 is in the holding mode (the transistor M8 is turned off but the transistor M8a is turned on). Thus, the currents in the amplifier circuit 20 are always stable while mode switching.

In the sampling mode, the transistors M7, M8, M9, M10 are controlled by biased voltage boc. The transistors M7, M8, M9, M10 operate in active region and a branched current $i_{t4}$ minus $i_{t5}$ charges the capacitor $C_h$ to a predetermined voltage if the biased voltage boc is over a threshold voltage until the relationship Of $V_{OUT}=V_N=V_P$ is established. As forgoing depicted, in the holding mode, the transistors M8, M10 are turned off. Therefore, the voltage $V_{OUT}$ will not be affected by the input voltage $V_P$. Although the transistor M8 is turned off, the transistor M8a is, however, turned on to keep the current without obstruction in the amplifier circuit 20.

Figure 1:
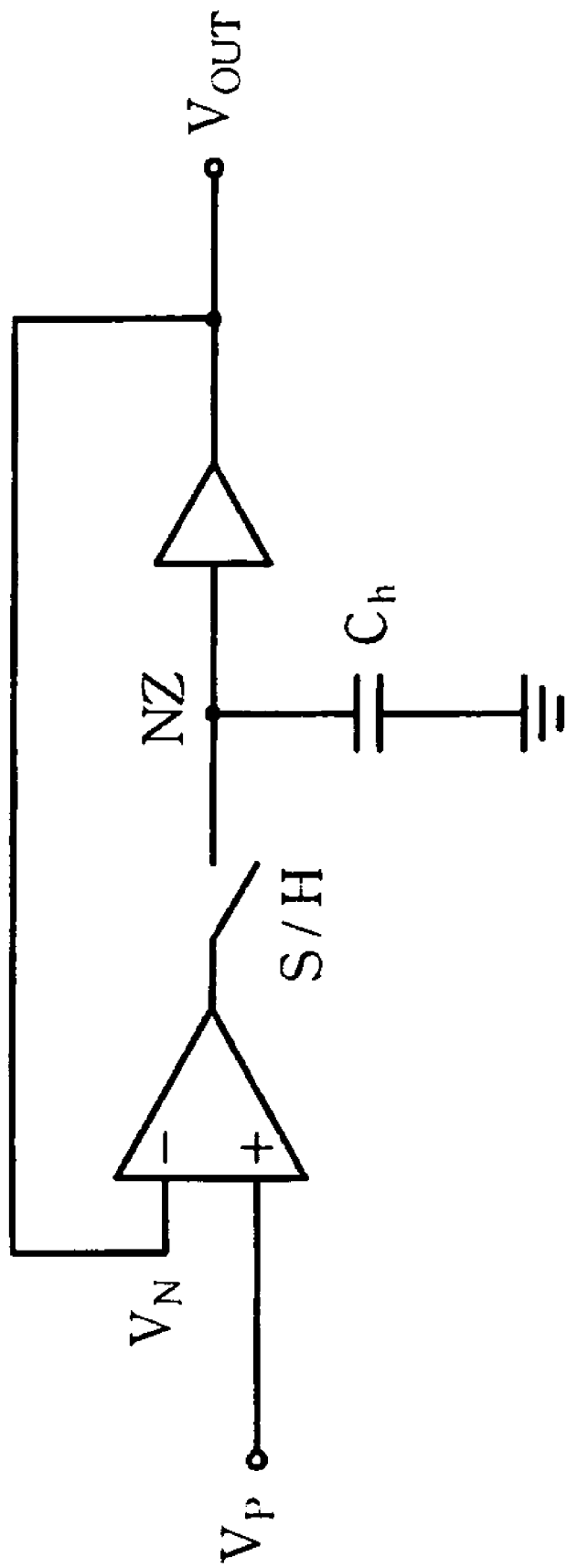
FIG. 1 is a SOP circuit according to prior art.
Figure 2:
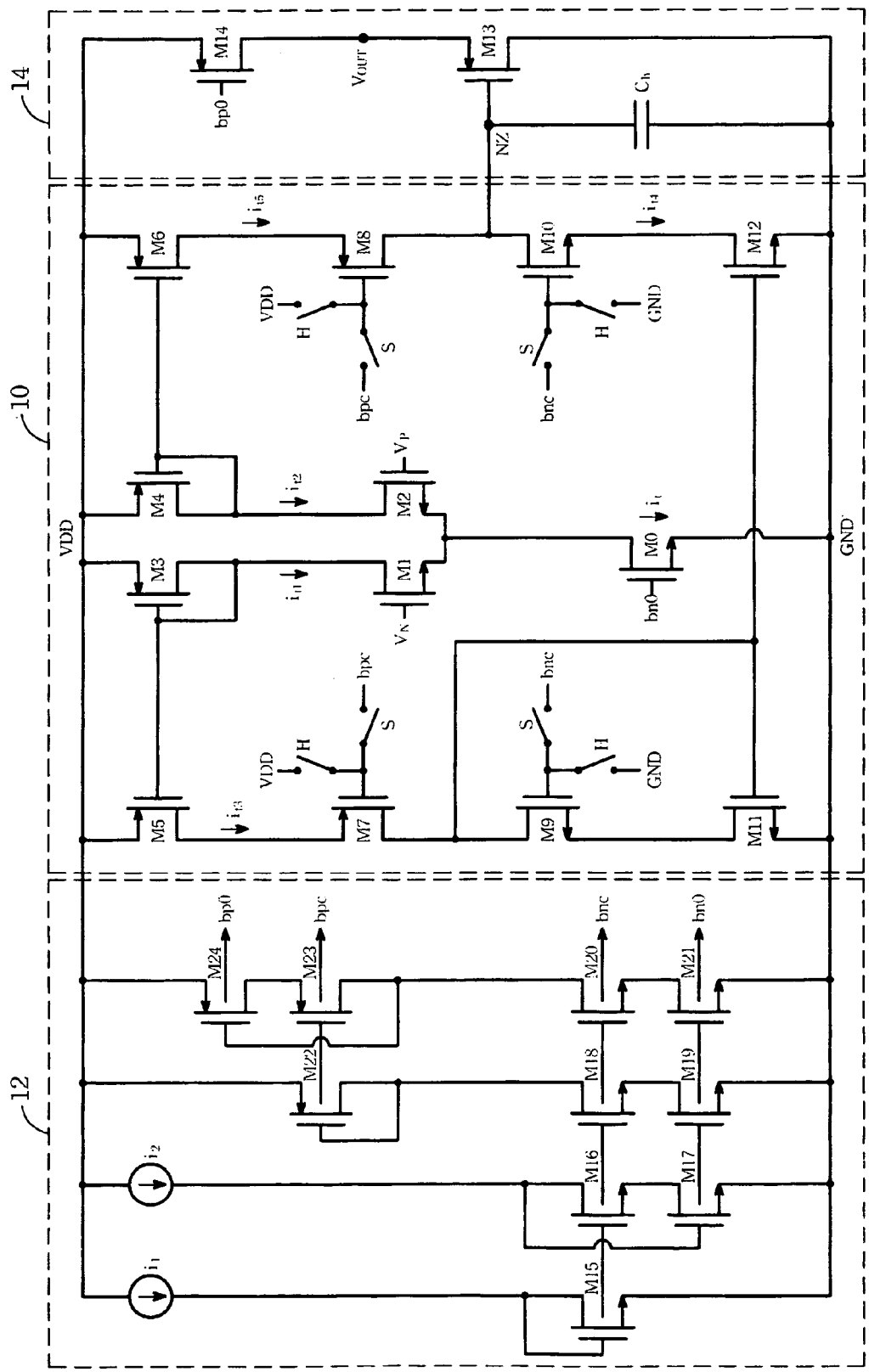
FIG. 2 shows detailed circuit of the SOP circuit according to prior art.

In conclusion, the biased circuit 22 includes only one current source to generate biased voltages for the amplifier circuit 20 and the buffer circuit 24. Comparing to the prior art, two sets of current source $i_1$, $i_2$ in the biased circuit 12 are utilized to generate biased voltages bn0, bnc, bp0, bpc shown in FIG. 2. Thus, if it is desired to shift the bandwidth of the SOP, a direct method is to change the current of the only one current source according to the present invention. Consequently, bandwidth variability is not restricted seriously. Moreover, the amplifier circuit 20 includes the sample-and-hold switch 26 and the complementary sample-and-hold switch 28 which are both controlled by the same biased voltage (boc), and one is activated while the other one is turned off according to the holding mode or sampling mode. The disadvantage of the setting limitation is avoided by this way according to the present invention. Furthermore, the complementary sample-and-hold switch 28 provides a current path in the holding mode to direct the mirror current to ground, so as to avoid the current variation due to effect of stray resistors while upon switching.

The benefits of the present invention are as following:

According to the present invention, the gate voltage of the transistors M7, M9 are biased by the voltage boc. In the meantime, the current path can either flow though transistor M8 or M8a in the sampling mode or holding mode. The total currents in the amplifier circuit 20 will be nearly constant. Consequently, neither ground voltage in inner nor external of the circuit will be very stable without variation, problem due to switch the sampling or holding mode.

To generate the biased voltage boc, bn0, bp0 for the amplifier circuit 20 and the buffer circuit 24, only one set of current source $i_1$ for the biased circuit 22 is required. Thus the SOP according to the present invention is readily controlled while comparing to the prior art. Thus the frequency bandwidth controlled is more flexible.

According to the embodiment of the present invention, at switching instant from the holding mode to sampling mode, the gates of the transistors M8, M10 receiving the voltage boc is simultaneously. The voltage boc is nearly an average of the $V_{DD}$ and GND, thus the charge recombination is very quick during switching. Hence, the operation rate is very fast.

While there have been described above the principles of the present invention in conjunction with specific devices, it is to be clearly understood that the foregoing description is made only by way of example and not as a limitation to the scope of the invention, Particularly, it is recognized that the teachings of the foregoing disclosure will suggest other modifications to those persons skilled in the relevant art. Such modifications may involve other features which are already known and which may be used instead of or in addition to features already described herein.

What is claimed is:

1. A switched operation amplifier comprising:
 a biased circuit, providing a first, a second, and a third biased signal;
 a amplifier circuit, having a first transistor, a second differential pair, a third, a fourth, a fifth current mirror, a sample-and-hold switch, and a complementary sample-and-hold switch, wherein said first transistor is controlled by said first biased signal so as to provide two reference currents for said third, and fourth current mirror, which are, respectively, connected with two transistors of said second differential pair, further, a mirror current of said third current mirror being controlled by said third biased signal to determine whether said third mirror current of said third current mirror is fed into a reference terminal of said fifth current mirror or not, and still a mirror current terminal of said fourth current mirror being connected with both of said sample-and-hold switch and said complementary sample-and-hold switch so as to provide a current path either though said sample-and-hold switch to a mirror terminal of said fifth current mirror, or said complementary sample-and-hold switch to ground depending on sampling mode or holding mode being selected, still two gates of said two transistors of said second differential pair served, respectively, as a positive and a negative terminal; and
 a buffer circuit having a capacitor, a second and a third transistor wherein said capacitor connected between ground and a node connected both of said sample-and-hold switch and a gate of said second transistor, and still a source terminal of said second transistor connected with a drain terminal of said third transistor, furthermore, said source terminal of said second transistor is served as a signal output terminal and fed back to said negative terminal and said third transistor is controlled by said second biased signal.

2. The switched operation amplifier according to claim 1, wherein said biased circuit comprises a first current mirror, a biased signal generator, a low output impedance buffer, said first current mirror generated said second biased signal according to a reference current, and further said biased signal generator connected with a mirror terminal of said first current mirror to generate said first biased signal, and still said low output impedance buffer connected with said first current mirror to generate said third biased signal according to a biased input signal.

3. The switched operation amplifier according to claim 2, wherein said low output impedance buffer comprises a fourth transistor, a first differential pair, a second current mirror, wherein said fourth transistor is controlled by said second biased signal.

4. The switched operation amplifier according to claim 2, wherein said biased input signal is generated by a voltage division circuit consisting of resistors.

5. The switched operation amplifier according to claim 2, wherein said biased generator is a transistor having a gate and drain thereof connected together.

6. The switched operation amplifier according to claim 1, wherein said sample-and-hold switch is composed of a fifth transistor in series connected with a sixth transistor and both of them are controlled by said third biased signal while switching to sampling mode.

7. The switched operation amplifier according to claim 1, wherein said complementary sample-and-hold switch is a transistor having a source terminal connected with said fourth current mirror and is controlled by said third biased signal while switching to holding mode.

8. A method of operating a sample-and-hold circuit, for a switched operation amplifier, said switched operation amplifier comprising a biased circuit for generating a third biased signal, a amplifier circuit and a buffer circuit, said amplifier circuit having a second differential pair, a fourth, a fifth current mirror, a sample-and-hold switch, and a complementary sample-and-hold switch, and said buffer circuit having a capacitor, said method comprising the steps of:
 charging said capacitor through said fourth current mirror and said fifth current mirror by turning on said sample-and-hold switch to do signal sampling, said capacitor providing a rising voltage to a negative terminal of said second differential pair until said negative terminal has the same voltage as an input voltage received by a positive terminal of said second differential pair; and
 discharging said capacitor by turning off said sample-and-hold switch to do signal holding, while said complementary sample-and-hold switch is turned on to provide a current path for said fourth current mirror.

9. The method of operating a sample-and-hold circuit according to claim 8, wherein said sample-and-hold switch and said complementary sample-and-hold switch are controlled by said third biased signal, and one is activated while the other one is turned off according to signal holding or sampling.

10. The method of operating a sample-and-hold circuit according to claim 8, wherein said biased circuit comprises only one current source to generate biased signals for said amplifier circuit and said buffer circuit.

11. The method of operating a sample-and-hold circuit according to claim 8, wherein said current path provided by said complementary sample-and-hold switch is conducted to ground.

* * * * *